(12) United States Patent
Kim

(10) Patent No.: US 10,615,781 B2
(45) Date of Patent: *Apr. 7, 2020

(54) SEMICONDUCTOR APPARATUS

(71) Applicant: SK hynix Inc., Icheon-si, Gyeonggi-do (KR)

(72) Inventor: Young Hoon Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/517,188

(22) Filed: Jul. 19, 2019

(65) Prior Publication Data
US 2019/0341912 A1 Nov. 7, 2019

Related U.S. Application Data

(63) Continuation of application No. 15/828,639, filed on Dec. 1, 2017, now Pat. No. 10,439,598.

(30) Foreign Application Priority Data

Apr. 18, 2017 (KR) .................. 10-2017-0049739

(51) Int. Cl.
| | | |
|---|---|---|
| H03K 25/00 | (2006.01) |
| H03K 3/027 | (2006.01) |
| H03K 5/151 | (2006.01) |
| H03K 5/1252 | (2006.01) |
| H03K 3/012 | (2006.01) |
| H03K 3/356 | (2006.01) |
| H03K 19/0175 | (2006.01) |

(52) U.S. Cl.
CPC ............ *H03K 3/027* (2013.01); *H03K 3/012* (2013.01); *H03K 3/356043* (2013.01); *H03K 5/1252* (2013.01); *H03K 5/151* (2013.01); *H03K 19/0175* (2013.01)

(58) Field of Classification Search
CPC ....... G11C 11/4076; G11C 7/22; H02M 3/156
See application file for complete search history.

(56) References Cited

U.S. PATENT DOCUMENTS

| 7,697,603 B1 * | 4/2010 | Wang ............... H04L 25/03885 333/18 |
| 9,793,885 B2 | 10/2017 | Dai |
| 2006/0244502 A1 | 11/2006 | Kim |
| 2013/0154737 A1 | 6/2013 | Shu |
| 2016/0359477 A1 | 12/2016 | Ihs |

FOREIGN PATENT DOCUMENTS

KR 1020090024444 A 3/2009

* cited by examiner

*Primary Examiner* — Sibin Chen
(74) *Attorney, Agent, or Firm* — William Park & Associates Ltd.

(57) ABSTRACT

A semiconductor apparatus includes a pulse generation circuit which generates a pulse signal in response to a clock, and an amplification circuit which generates an output signal in response to an input signal, the clock, and the pulse signal, wherein the amplification circuit voltage is configured to amplify a voltage level difference between a pair of latch input nodes.

8 Claims, 3 Drawing Sheets

SEMICONDUCTOR APPARATUS

CROSS-REFERENCES TO RELATED APPLICATIONS

The present application is a continuation application of U.S. patent application Ser. No. 15/828,639, filed on Dec. 1, 2017, and claims priority under 35 U.S.C. § 119(a) to Korean application number 10-2017-0049739, filed on Apr. 18, 2017, in the Korean Intellectual Property Office, which is incorporated herein by reference in its entirety.

BACKGROUND

1. Technical Field

Various embodiments generally relate to a semiconductor integrated circuit, and, more particularly, to a semiconductor apparatus.

2. Related Art

A semiconductor apparatus is configured to receive and output electrical signals.

Therefore, the semiconductor apparatus includes circuits for receiving and outputting electrical signals.

If noise is included in a signal which is received by the semiconductor apparatus, the semiconductor apparatus may malfunction by mistaking the noise as a signal.

SUMMARY

In an embodiment, a semiconductor apparatus may include: a pulse generation circuit configured to generate a pulse signal in response to a clock; and an amplification circuit configured to generate an output signal in response to an input signal, the clock, and the pulse signal, wherein the amplification circuit voltage is configured to amplify a voltage level difference between a pair of latch input nodes.

In an embodiment, a semiconductor apparatus may include: a pulse generation circuit configured to enable a pulse signal in response to a rising edge of a clock, and generating the pulse signal of which an enable period is shorter than a high period of the clock; and an amplification circuit configured to generate an output signal in response to an input signal in the enable period of the pulse signal during the high period of the clock, and retaining a voltage level of the output signal if the pulse signal is disabled even during the high period of the clock.

DETAILED DESCRIPTION

Hereinafter, a semiconductor apparatus will be described below with reference to the accompanying drawings through various examples of embodiments.

Figure 1:
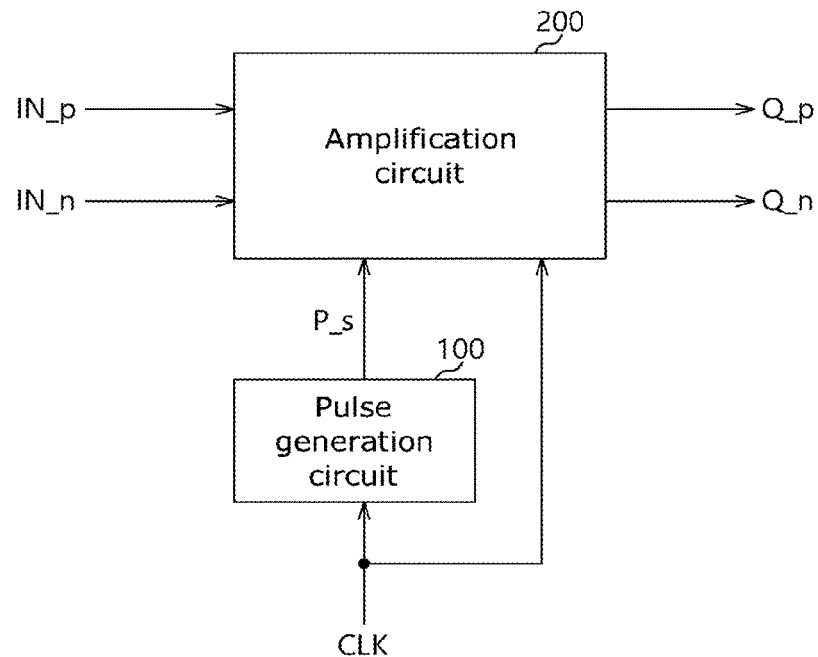
FIG. 1 is a configuration diagram illustrating a representation of an example of a semiconductor apparatus in accordance with an embodiment.

Referring to FIG. 1, a semiconductor apparatus in accordance with an embodiment may include a pulse generation circuit 100 and an amplification circuit 200.

The pulse generation circuit 100 may generate a pulse signal P_s in response to a clock CLK. For example, the pulse generation circuit 100 may generate the pulse signal P_s which is enabled to a low level for a predetermined time, at a rising edge of a clock CLK.

The amplification circuit 200 may generate output signals Q_p and Q_n in response to the clock CLK and input signals IN_p and IN_n. For example, the amplification circuit 200 is activated when the clock CLK is high, and is deactivated when the clock CLK is low. If activated, the amplification circuit 200 may generate the output signals Q_p and Q_n by amplifying the input signals IN_p and IN_n. If deactivated, the amplification circuit 200 may fix the output signals Q_p and Q_n to a specified voltage level regardless of a state of the input signals IN_p and IN_n. The input signals IN_p and IN_n may include a positive input signal IN_p and a negative input signal IN_n, and the output signals Q_p and Q_n may include a positive output signal Q_p and a negative output signal Q_n. The amplification circuit 200 may be activated in the high level period of the clock CLK. The activated amplification circuit 200 may generate the positive output signal Q_p and the negative output signal Q_n by amplifying a difference between the voltage level of the positive input signal IN_p and the negative input signal IN_n. When the activated amplification circuit 200 is activated, a first latch input node N_LiA (see FIG. 2) and a second latch input node N_LiB (see FIG. 2) may retain different voltage levels for an enable period of the pulse signal P_s, that is, for the low level period of the pulse signal P_s. A voltage difference may be induced between the first latch input node N_LiA and the second latch input node N_LiB by a voltage level difference between the positive input signal IN_p and the negative input signal IN_n. The low level period of the pulse signal P_s may be shorter than the high level period of the clock CLK. If the pulse signal P_s is disabled to a high level, the activated amplification circuit 200 may couple the first latch input node N_LiA and the second latch input node N_LiB, and make the voltage levels of the first latch input node N_LiA and the second latch input node N_LiB the same as each other. The amplification circuit 200 may be deactivated in the low level period of the clock CLK. The deactivated amplification circuit 200 may fix the positive output signal Q_p and the negative output signal Q_n to a low level regardless of the state of the positive input signal IN_p and the negative input signal IN_n.

Figure 2:
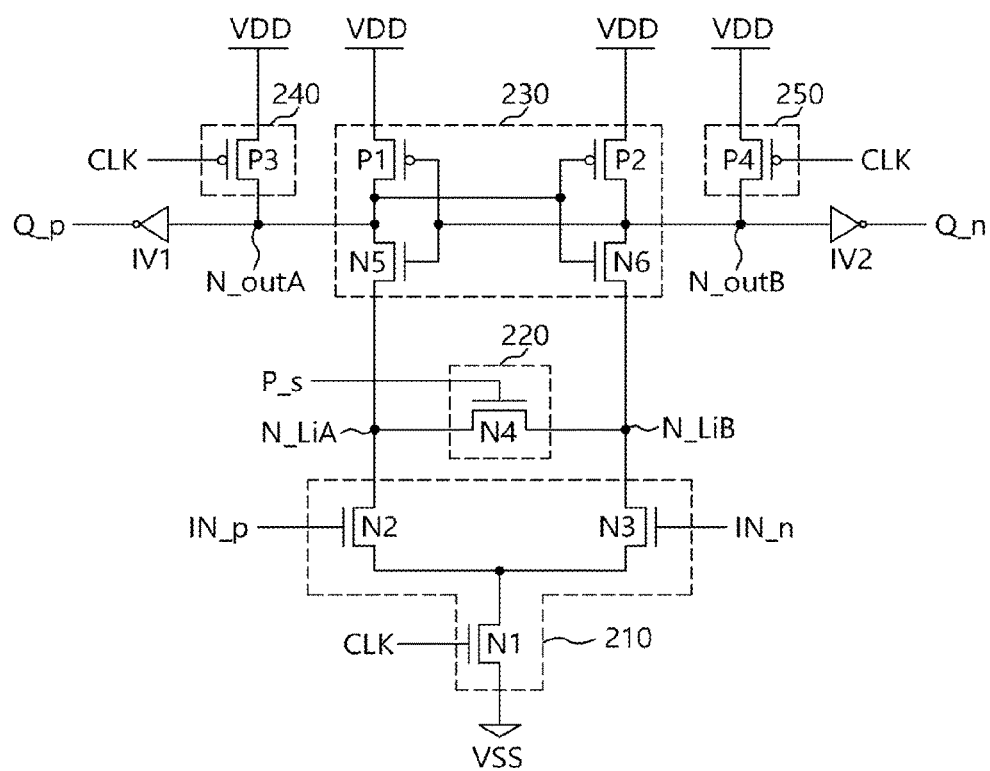
FIG. 2 is a configuration diagram illustrating a representation of an example of an amplification circuit shown in FIG. 1.

Referring to FIG. 2, the amplification circuit 200 may include a signal input circuit 210, a noise elimination circuit 220, a latch amplification circuit 230, and first and second output fixing circuits 240 and 250.

The signal input circuit 210 may induce a voltage difference between the first and second latch input nodes N_LiA and N_LiB in response to the clock CLK, the positive input signal IN_p, and the negative input signal IN_n. For example, the signal input circuit 210 may induce a voltage difference between the first latch input node N_LiA and the second latch input node N_LiB by sensing a difference in the voltage level of the positive input signal IN_p and the negative input signal IN_n for the rising period, that is, the high level period, of the clock CLK. The signal input circuit 210 may include first to third transistors N1, N2, and N3. The first transistor N1 has a gate which receives the clock CLK and a source to which a ground terminal VSS is coupled. The second transistor N2 has a gate which receives the positive input signal IN_p, a drain to which the first latch input node N_LiA is coupled, and a source to which the drain of the first transistor N1 is coupled. The third transistor N3 has a gate which receives the negative input signal IN_n, a drain to which the second latch input node N_LiB is coupled, and a source to which the drain of the first transistor N1 is coupled.

The noise elimination circuit 220 may decouple or couple the first and second latch input nodes N_LiA and N_LiB in response to the pulse signal P_s. For example, the noise elimination circuit 220 decouples the first and second latch input nodes N_LiA and N_LiB for the enable period, that is, the low level period, of the pulse signal P_s. The noise elimination circuit 220 couples the first and second latch input nodes N_LiA and N_LiB for the disable period, that is, the high level period, of the pulse signal P_s.

The noise elimination circuit 220 may include a fourth transistor N4. The fourth transistor N4 has a gate which receives the pulse signal P_s, and a source and a drain to which the first and second latch input nodes N_LiA and N_LiB are respectively coupled.

The latch amplification circuit 230 amplifies a voltage difference between the first and second latch input nodes N_LiA and N_LiB, and induces a voltage level difference between first and second output nodes N_outA and N_outB. For example, the latch amplification circuit 230 lowers the voltage level of the second output node N_outB while raising the voltage level of the first output node N_outA in response to a voltage difference between the first and second latch input nodes N_LiA and N_LiB. Moreover, the latch amplification circuit 230 may raise the voltage level of the second output node N_outB while lowering the voltage level of the first output node N_outA in response to a voltage difference between first and second latch input nodes N_LiA and N_LiB. Thus, the latch amplification circuit 230 may generate at least one output signal Q_p and Q_n in response to a voltage difference between the first and second latch input nodes N_LiA and N_LiB.

The latch amplification circuit 230 may include fifth to eighth transistors N5, N6, P1, and P2. The fifth transistor N5 has a gate to which the gate of the seventh transistor P1 and the second output node N_outB are coupled in common, a drain to which the drain of the seventh transistor P1 is coupled, and a source to which the first latch input node N_LiA is coupled. The sixth transistor N6 has a gate to which the gate of the eighth transistor P2 and the first output node N_outA are coupled in common, a drain to which the drain of the eighth transistor P2 is coupled, and a source to which the second latch input node N_LiB is coupled. The seventh transistor P1 has a source which is applied with an external voltage VDD. The eighth transistor P2 has a source which is applied with the external voltage VDD.

The first output fixing circuit 240 fixes the first output node N_outA to a specified level in response to the clock CLK. For example, the first output fixing circuit 240 fixes the first output node N_outA to the level of the external voltage VDD in a period in which the clock CLK has a low level.

The first output fixing circuit 240 may include a ninth transistor P3. The ninth transistor P3 has a gate which receives the clock CLK, a source which is applied with the external voltage VDD, and a drain to which the first output node N_outA is coupled.

The second output fixing circuit 250 fixes the second output node N_outB to a specified level in response to the clock CLK. For example, the second output fixing circuit 250 fixes the second output node N_outB to the level of the external voltage VDD in a period that the clock CLK has the low level.

The second output fixing circuit 250 may include a tenth transistor P4. The tenth transistor P4 has a gate which receives the clock CLK, a source which is applied with the external voltage VDD, and a drain to which the second output node N_outB is coupled.

The amplification circuit 200 may further include first and second inverters IV1 and IV2. The first inverter IV1 may invert the voltage level of the first output node N_outA, and output the positive output signal Q_p. The second inverter IV2 may invert the voltage level of the second output node N_outB, and output the negative output signal Q_n.

The operation of the semiconductor apparatus in accordance with an embodiment, configured as mentioned above, will be described below.

The pulse generation circuit 100 may generate the pulse signal P_s in response to the clock CLK. For example, the pulse generation circuit 100 may generate the pulse signal P_s which is enabled to the low level at the rising edge of the clock CLK and is disabled to the high level after a predetermined time. The enable period, that is, the low level period, of the pulse signal P_s may be shorter than the high level period of the clock CLK.

The amplification circuit 200 may generate the output signals Q_p and Q_n in response to the input signals IN_p and IN_n, the pulse signal P_s, and the clock CLK. For example, the amplification circuit 200 may be activated or deactivated in response to the clock CLK. The amplification circuit 200 may be activated for the high period of the clock CLK. The amplification circuit 200 may be deactivated for the low period of the clock CLK. The activated amplification circuit 200 may generate the output signals Q_p and Q_n in response to the input signals IN_p and IN_n. The deactivated amplification circuit 200 may fix the output signals Q_p and Q_n to a specified level, that is, the low level, regardless of the state of the input signal IN_p and IN_n.

The operation of the amplification circuit 200 will be described below in detail with reference to FIG. 2. The input signals IN_p and IN_n as a differential signal may include the positive input signal D_inp and the negative input signal D_inn. The output signals Q_p and Q_n as a differential signal may include the positive output signal Q_p and the negative output signal Q_n.

The amplification circuit 200 may include the signal input circuit 210, the noise elimination circuit 220, the latch amplification circuit 230, and the first and second output fixing circuits 240 and 250.

The signal input circuit 210 may induce a difference in the voltage level between the first latch input node N_LiA and the second latch input node N_LiB in response to a difference in the voltage level of the positive input signal IN_p and the negative input signal IN_n during the high period of the clock CLK. In other words, the signal input circuit 210 may induce a difference in the voltage level between the first and second latch input nodes N_LiA and N_LiB in response to the input signal for the high period of the clock CLK.

The noise elimination circuit 220 may decouple the first and second latch input nodes N_LiA and N_LiB for the enable period, that is, the low level period, of the pulse signal P_s, and may couple the first and second latch input nodes N_LiA and N_LiB for the disable period, that is, the high level period, of the pulse signal P_s, in response to the pulse signal P_s which may be enabled at a rising edge of the clock CLK. That is to say, the noise elimination circuit 220 may decouple the first and second latch input nodes N_LiA and N_LiB for only the enable period, that is, the low level period, of the pulse signal P_s, such that a voltage difference between the first and second latch input nodes N_LiA and N_LiB induced in the signal input circuit 210 is transferred to the latch amplification circuit 230. The noise elimination circuit 220 may couple the first and second latch input nodes N_LiA and N_LiB for the disable period, that is, the high level period, of the pulse signal P_s, such that a voltage difference between the first and second latch input nodes N_LiA and N_LiB induced in the signal input circuit 210 disappears. In other words, even though the signal input circuit 210 induces a voltage difference between the first and second latch input nodes N_LiA and N_LiB for the disable period, that is, the high level period, of the pulse signal P_s, the noise elimination circuit 220 may couple the first and second latch input nodes N_LiA and N_LiB and may make the voltages of the first and second latch input nodes N_LiA and N_LiB have the same voltage level.

The latch amplification circuit 230 may sense and amplify a voltage difference between the first and second latch input nodes N_LiA and N_LiB which is transferred in the enable period (the low level period) of the pulse signal P_s, and thereby forms the voltage levels of the first and second output nodes N_outA and N_outB. For example, the latch amplification circuit 230 may lower the voltage level of the second output node N_outB when raising the voltage level of the first output node N_outA in response to the voltage difference between the first and second latch input nodes N_LiA and N_LiB induced for the enable period (the low level period) of the pulse signal P_s. The latch amplification circuit 230 may raise the voltage level of the second output node N_outB when lowering the voltage level of the first output node N_outA in response to a voltage difference between the first and second latch input nodes N_LiA and N_LiB induced for the enable period (the low level period) of the pulse signal P_s.

If the voltage levels of the first and second latch input nodes N_LiA and N_LiB are the same for the disable period (high level period) of the pulse signal P_s, because the voltage difference between the first and second latch input nodes N_LiA and N_LiB is not sensed, the latch amplification circuit 230 may retain the voltage levels of the first and second output nodes N_outA and N_outB which are formed for the enable (low) period of the pulse signal P_s. Thus, the latch amplification circuit 230 may retain a voltage level of at least one of the output signals Q_p and Q_n when voltage levels of the first and second latch input nodes N_LiA and N_LiB are the same.

The first output fixing circuit 240 fixes the voltage level of the first output node N_outA to the level of the external voltage VDD for the low period of the clock CLK, that is, the deactivation period of the amplification circuit 200. The first output fixing circuit 240 may fix the positive output signal Q_p to a specified level in response to the clock CLK. For example, the first output fixing circuit 240 may fix the positive output signal Q_p to a low level for a low period of the clock CLK.

The second output fixing circuit 250 fixes the voltage level of the second output node N_outB to the level of the external voltage VDD for the low period of the clock CLK, that is, the deactivation period of the amplification circuit 200. The second output fixing circuit 250 may fix the negative output signal Q_n to a specified level in response to the clock CLK. For example, the second output fixing circuit 250 may fix the negative output signal Q_n to a low level for a low period of the clock CLK.

As a result, the semiconductor apparatus in accordance with an embodiment is activated. Accordingly, if the amplification circuit 200 is activated in the high period of the clock CLK, the amplification circuit 200 generates one or more of the output signals Q_p and Q_n in response to at least one of the input signals IN_p and IN_n for only the enable (low) period of the pulse signal P_s generated at a rising edge of the clock CLK, and the amplification circuit 200 retains voltage levels of the one or more output signals Q_p and Q_n regardless of the state of the input signals IN_p and IN_n if the pulse signal P_s is disabled (high) even during the high period of the clock CLK. Also, the semiconductor apparatus in accordance with an embodiment is deactivated in the low period of the clock CLK, and fixes the output signals Q_p and Q_n to a low level regardless of the state of the input signals IN_p and IN_n.

The operation of the semiconductor apparatus in accordance with the embodiment will be described below with reference to FIG. 3.

Figure 3:
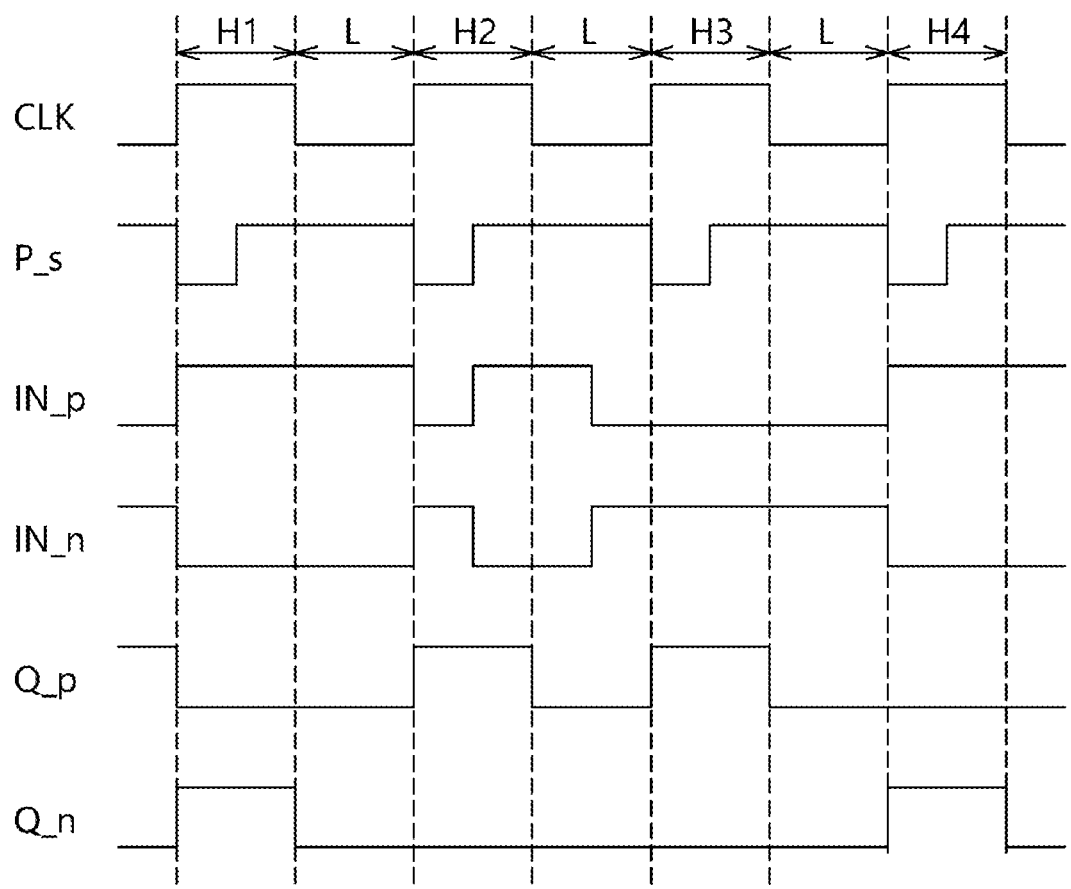
FIG. 3 is a representation of an example of a timing diagram to assist in an explanation of the semiconductor apparatus in accordance with an embodiment.

Referring to FIG. 3, each time the clock CLK transitions to a high level, the pulse signal P_s is enabled to the low level for a predetermined time.

The output signals Q_p and Q_n may be generated by amplifying a voltage difference between the input signals IN_p and IN_n for the low level period of the pulse signal P_s. The input signals IN_p and IN_n may include the positive input signal IN_p and the negative input signal IN_n, and the output signals Q_p and Q_n may include the positive output signal Q_p and the negative output signal Q_n.

For the low level enable period of the pulse signal P_s during a first high period H1 of the clock CLK, the positive input signal IN_p has a high level and the negative input signal IN_n has a low level. At this time, the positive output signal Q_p is outputted having a low level and the negative output signal Q_n is outputted having a high level. The levels of the positive output signal Q_p and the negative output signal Q_n may be retained for the first high period H1 of the clock CLK.

For a low period L of the clock CLK after the first high period H1 ends, the positive output signal Q_p and the negative output signal Q_n are low regardless of the state of the positive input signal IN_p and the negative input signal IN_n.

For the low level enable period of the pulse signal P_s during a second high period H2 of the clock CLK, the positive input signal IN_p has a low level and the negative input signal IN_n has a high level. At this time, the positive output signal Q_p is outputted having a high level and the negative output signal Q_n is outputted having a low level. When the levels of the positive input signal IN_p and the negative input signal IN_n are changed for the second high period H2 of the clock CLK, the levels of the positive output signal Q_p and the negative output signal Q_n are determined and retained in response to only the levels of the positive input signal IN_p and the negative input signal IN_n in the low level period of the pulse signal P_s.

For a low period L of the clock CLK after the second high period H2 ends, the positive output signal Q_p and the negative output signal Q_n are low regardless of the state of the positive input signal IN_p and the negative input signal IN_n.

For the low level enable period of the pulse signal P_s during a third high period H3 of the clock CLK, the positive input signal IN_p has a low level and the negative input signal IN_n has a high level. At this time, the positive output signal Q_p is outputted having a high level and the negative output signal Q_n is outputted having a low level. The levels of the positive output signal Q_p and the negative output signal Q_n are retained for the third high period H3 of the clock CLK.

For a low period L of the clock CLK after the third high period H3 ends, the positive output signal Q_p and the negative output signal Q_n are low regardless of the state of the positive input signal IN_p and the negative input signal IN_n.

For the low level enable period of the pulse signal P_s during a fourth high period H4 of the clock CLK, the positive input signal IN_p has a high level and the negative input signal IN_n has a low level. At this time, the positive output signal Q_p is outputted having a low level and the negative output signal Q_n is outputted having a high level. The levels of the positive output signal Q_p and the negative output signal Q_n are retained for the fourth high period H4 of the clock CLK.

Accordingly, the semiconductor apparatus in accordance with an embodiment generates the output signals Q_p and Q_n in response to the input signals IN_p and IN_n in only the enable period of the pulse signal P_s generated at the rising edge of the clock CLK, that is, when the clock CLK transitions to the high level. The semiconductor apparatus may retain the levels of the output signals Q_p and Q_n regardless of changes to the input signals IN_p and IN_n even in a high period of the clock CLK if the pulse signal P_s is disabled. Also, the semiconductor apparatus in accordance with an embodiment fixes the output signals Q_p and Q_n to a low level for the low period of the clock CLK.

While various embodiments have been described above, it will be understood by those skilled in the art that the embodiments described are examples only. Accordingly, the semiconductor apparatus described herein should not be limited based on the described embodiments.

Figure 4:
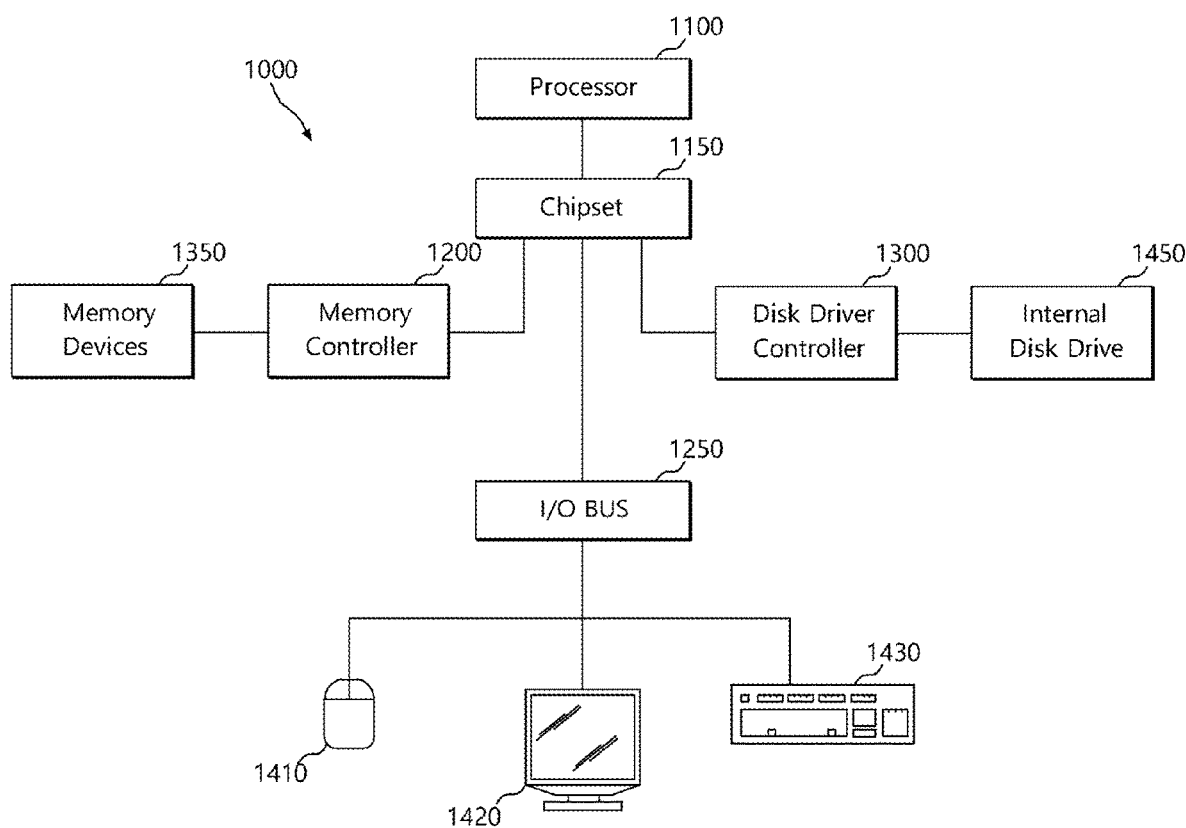
FIG. 4 is a representation of a system employing a semiconductor apparatus in accordance with the various embodiments discussed above with relation to FIGS. 1-3.

The semiconductor apparatus discussed above (see FIGS. 1-3) are particularly useful in the design of memory devices, processors, and computer systems. For example, referring to FIG. 4, a block diagram of a system employing a semiconductor apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor apparatus as discussed above with reference to FIGS. 1-3. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus as discussed above with relation to FIGS. 1-3, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 4 is merely one example of a system 1000 employing a semiconductor apparatus as discussed above with relation to FIGS. 1-3. In alternate embodiments, such as, for example but not limited to, cellular phones or digital cameras, the components may differ from the embodiments illustrated in FIG. 4.

What is claimed is:

1. A semiconductor apparatus comprising:
   a pulse generation circuit configured to generate a pulse signal in response to a clock; and
   an amplification circuit configured to generate an output signal in response to an input signal, the clock, and the pulse signal, wherein the amplification circuit is configured to amplify a voltage level difference between a pair of latch input nodes,
   wherein the pulse signal is enabled at a rising edge of the clock, and
   wherein the amplification circuit comprises:
   a signal input circuit configured to induce the voltage level difference between the pair of latch input nodes in response to the clock and the input signal;
   a noise elimination circuit configured to couple or decouple the pair of latch input nodes in response to the pulse signal;
   a latch amplification circuit configured to generate the output signal in response to the voltage difference between the pair of latch input nodes; and
   an output fixing circuit configured to fix the output signal to the specified level in response to the clock.

2. The semiconductor apparatus according to claim 1, wherein the enable period of the pulse signal is shorter than a specified level period of the clock.

3. The semiconductor apparatus according to claim 2, wherein the enable period of the pulse signal is shorter than a high period of the clock.

4. The semiconductor apparatus according to claim 1,
   wherein the amplification circuit is activated or deactivated in response to the clock, and
   wherein, when the amplification circuit is activated, the amplification circuit generates the output signal in response to the input signal for only the enable period of the pulse signal, and retains a level of the output signal in a disable period of the pulse signal.

5. The semiconductor apparatus according to claim 4, wherein, when the amplification circuit is deactivated, the amplification circuit fixes the output signal to a specified voltage level regardless of a state of the input signal.

6. The semiconductor apparatus according to claim 1, wherein the signal input circuit induces the voltage level difference between the pair of latch input nodes in response to the input signal for the high period of the clock.

7. The semiconductor apparatus according to claim 1, wherein the noise elimination circuit decouples the pair of latch input nodes when the pulse signal is enabled, and couples the pair of latch input nodes when the pulse signal is disabled.

8. The semiconductor apparatus according to claim 1, wherein the output fixing circuit fixes the output signal to a low level for a low period of the clock.

\* \* \* \* \*